(12) United States Patent
Bedell et al.

(10) Patent No.: US 9,455,180 B1
(45) Date of Patent: Sep. 27, 2016

(54) CONTROLLED SPALLING OF FINE FEATURES

(71) Applicant: International Business Machines Corporation, Armonk, NY (US)

(72) Inventors: Stephen W. Bedell, Wappingers Falls, NY (US); Ning Li, White Plains, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/943,118

(22) Filed: Nov. 17, 2015

(51) Int. Cl.
| | | |
|---|---|---|
| H01L 21/20 | (2006.01) | |
| H01L 21/768 | (2006.01) | |
| H01L 49/02 | (2006.01) | |
| H01L 21/683 | (2006.01) | |
| H01L 21/027 | (2006.01) | |
| H01L 21/324 | (2006.01) | |
| H01L 31/18 | (2006.01) | |

(52) U.S. Cl.
CPC ..... *H01L 21/76871* (2013.01); *H01L 21/0274* (2013.01); *H01L 21/324* (2013.01); *H01L 21/6836* (2013.01); *H01L 28/20* (2013.01); *H01L 31/1896* (2013.01); *H01L 2221/68381* (2013.01)

(58) Field of Classification Search
None
See application file for complete search history.

(56) References Cited

U.S. PATENT DOCUMENTS

| 8,709,957 | B2 | 4/2014 | Bedell et al. | |
| 9,058,990 | B1 * | 6/2015 | Bayram | H01L 21/0254 |
| 2013/0316538 | A1 | 11/2013 | Bedell et al. | |

OTHER PUBLICATIONS

Bedell, et al., "Kerf-Less Removal of Si, Ge, and III-V Layers by Controlled Spalling to Enable Low-Cost PV Technologies", IEEE Journal of Photovoltaics, vol. 2, No. 2, Apr. 2012.

* cited by examiner

*Primary Examiner* — Angel Roman
(74) *Attorney, Agent, or Firm* — Louis Percello

(57) ABSTRACT

In one example, a method for fabricating a device includes patterning a substrate with a set of features forming a portion of the device, depositing a first photoresist layer on the substrate by a first deposition process, depositing a second photoresist layer on the first photoresist layer by a second deposition process, and inducing spalling of the features from the substrate, after depositing the second photoresist layer.

20 Claims, 9 Drawing Sheets

100

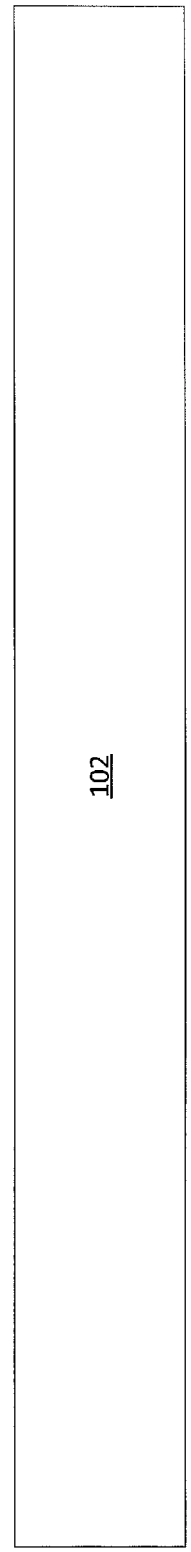

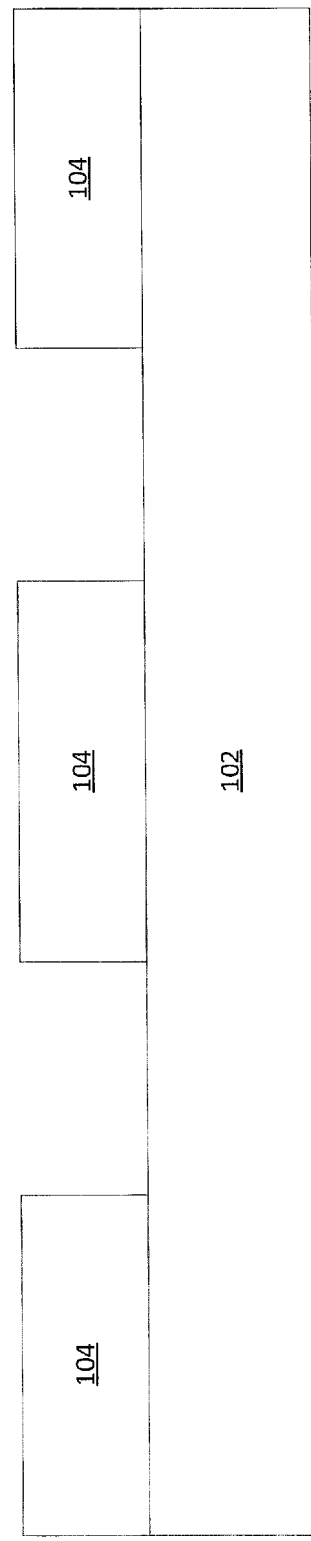

CONTROLLED SPALLING OF FINE FEATURES

BACKGROUND OF THE DISCLOSURE

Spalling is a process in which stress causes particles of a brittle material to detach from the surface of the material. Controlled spalling can be used to fabricate fine features of microelectronics and other devices, such as those used in medical implants (e.g., health monitors, biomedical devices), flexible sensor arrays, imaging devices, electronics built on three-dimensional surfaces, photovoltaics, and wearable electronics.

SUMMARY OF THE DISCLOSURE

In one example, a method for fabricating a device includes patterning a substrate with a set of features forming a portion of the device, depositing a first photoresist layer on the substrate by a first deposition process, depositing a second photoresist layer on the first photoresist layer by a second deposition process, and inducing spalling of the features from the substrate, after depositing the second photoresist layer.

In another example, a method for fabricating a device includes patterning a substrate with a set of features forming a portion of the device, depositing a first photoresist layer directly on the substrate, patterning the first photoresist layer to create a series of trenches, depositing a conformal seed layer directly on the first photoresist layer and in the series of trenches, depositing a second photoresist layer directly on the seed layer, patterning the second photoresist layer to maintain the series of trenches, depositing a stressor layer directly on the second photoresist layer and in the series of trenches, applying a first adhesive layer to the stressor layer, inducing spalling of the features from the substrate, and pulling the first adhesive layer in a direction away from the substrate, after spalling is induced, so that portions of the substrate are detached and lifted away from a body of the substrate.

BRIEF DESCRIPTION OF THE DRAWINGS

The teachings of the present disclosure can be readily understood by considering the following detailed description in conjunction with the accompanying drawings, in which:

FIGS. 1A-1I illustrate cross sectional views of a structure for patterning fine spalled features during various stages of a patterning process performed according to examples of the present disclosure.

To facilitate understanding, identical reference numerals have been used, where possible, to designate identical elements that are common to the Figures.

DETAILED DESCRIPTION

In one example, a dual-layer photoresist structure for controlled spalling of fine features is disclosed. The dual-layer photoresist structure may be employed in a controlled spalling process to pattern fine features of a device down to approximately ten µm. For instance, the dual-layer photoresist structure allows an electroplating process to be performed uniformly on a metal seed layer. Subsequently, spalling can be performed in a controlled manner on small features across the substrate or wafer. Thus, the disclosed process is able to produce features having a finer resolution than is possible using conventional spalling techniques.

Examples of the present disclosure provide a process in which the dual-layer photoresist structure is deposited between a patterned surface layer, such as a patterned silicon substrate, and a stressor layer, such as a layer of plated nickel. The two layers of the photoresist structure may be deposited in separate processing steps and may be physically separated by an intervening layer of a seed material. The seed material may be formed from the same material as the stressor layer (e.g., nickel). Controlled spalling may continue by applying stress to the structure and utilizing an adhesive, such as stretchable and/or ultraviolet (UV) release tape.

FIGS. 1A-1I illustrate cross sectional views of a structure 100 for patterning fine spalled features during various stages of a patterning process performed according to examples of the present disclosure. As such, when viewed in sequence, FIGS. 1A-1I also serve as a flow diagram for the patterning process.

Referring to FIG. 1A, the structure 100 begins as a substrate 102, formed, for example, from bulk silicon (Si) or another brittle semiconductor material, such as germanium (Ge), gallium arsenide (GaAs), indium phosphide (InP), gallium nitride (GaN), and others. The substrate forms the surface layer of the structure 100. Fine features are patterned onto the surface of the substrate 102. The fine features may form, for example, a resistor of an electronic device or circuit.

Referring to FIG. 1B, a first photoresist layer 104 is next deposited directly on the substrate 102 and then patterned. The first photoresist layer 104 may be deposited, for example, by spin coating, and then patterned, for example, by photolithography. Patterning of the first photoresist layer 104 removes portions of the first photoresist layer 104 residing directly above patterned features of the substrate 102, but leaves other portions of the first photoresist layer 104 intact. This creates a series of trenches in the first photoresist layer 104.

Figure 1C:
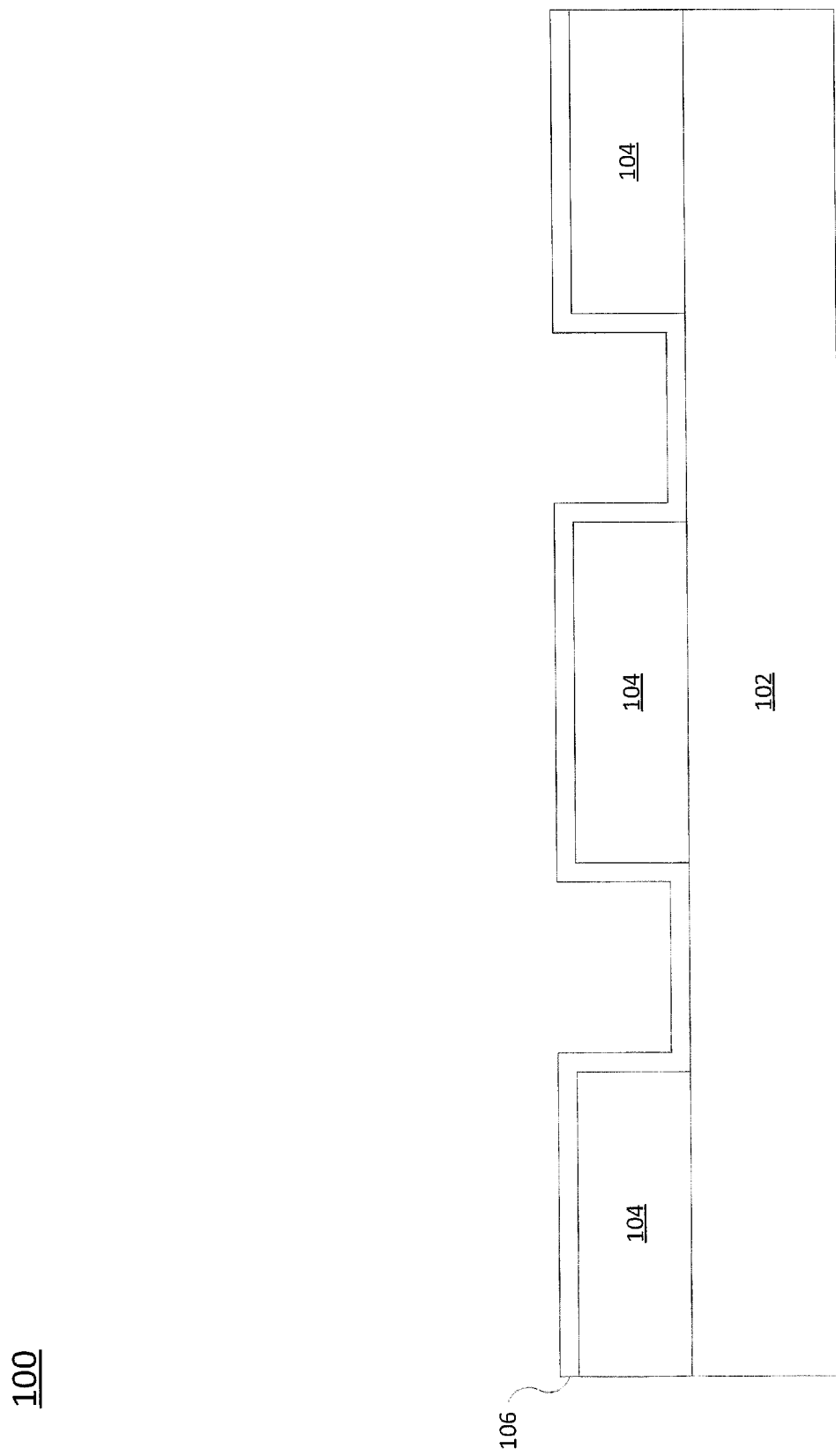

Referring to FIG. 1C, a conformal seed layer 106 is next deposited over the substrate 102 and the patterned first photoresist layer 104. The seed layer 106 conforms to the profile created by the series of trenches. In one example, the seed layer has a thickness in a range of a few nanometers to hundreds of nanometers and may be deposited, for example, by sputtering, thermal evaporation, or other processes. In one example, the seed layer 106 comprises a stressor material formed from a metal or metal-containing material. For instance, the seed layer 106 may include nickel (Ni). In a further example, the seed layer 106 includes a thin adhesion layer, formed, for example, from titanium (Ti), followed by a thicker layer of a stressor material that is not easily oxidized.

Figure 1D:
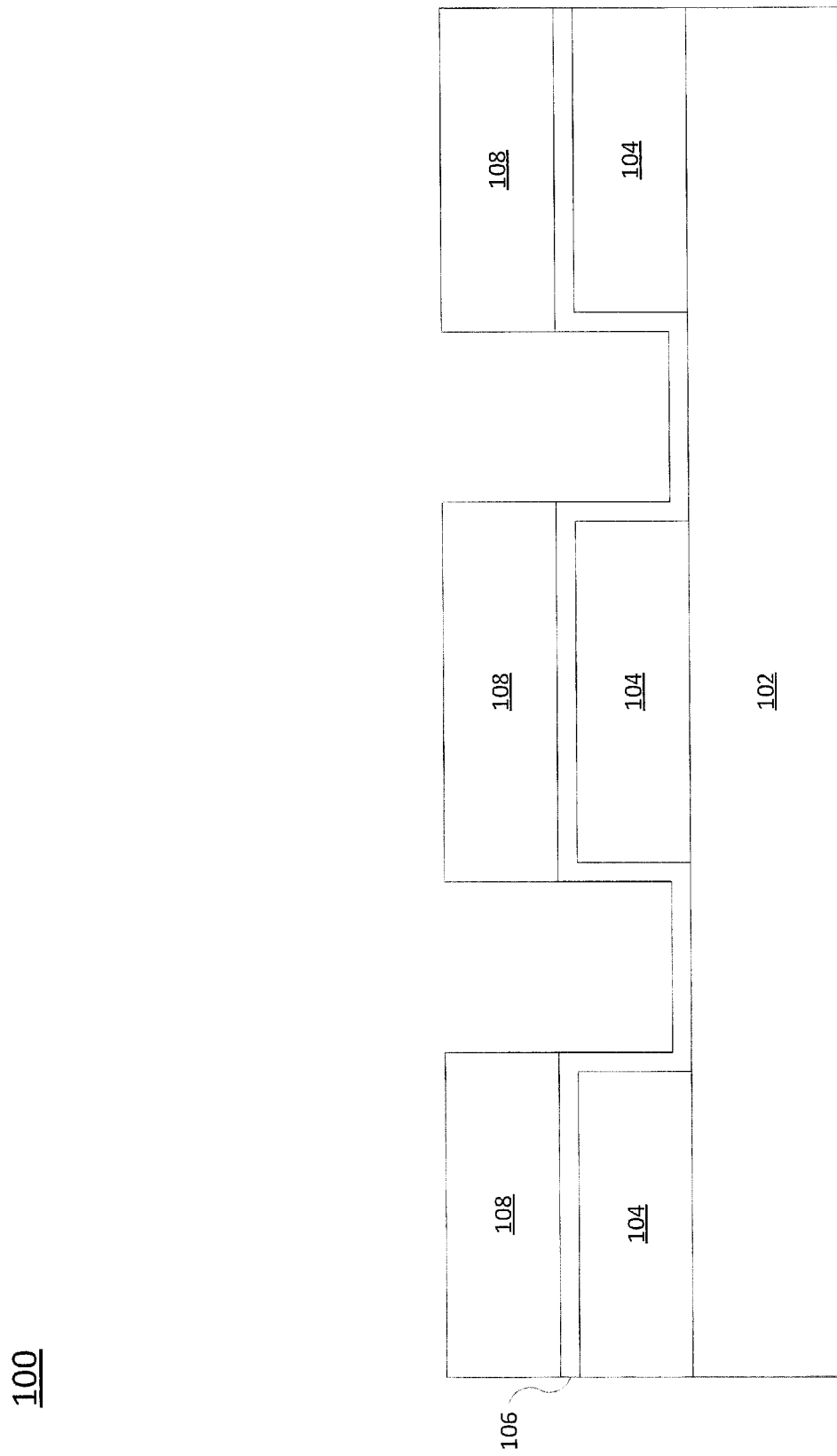

Referring to FIG. 1D, a second photoresist layer 108 is next deposited directly on the seed layer 106 and then patterned. The second photoresist layer 108 may be deposited, for example, by spin coating, and then patterned, for example, by photolithography. Patterning of the second photoresist layer 108 removes portions of the second photoresist layer 108 residing directly above patterned features of the substrate 102, but leaves other portions of the second photoresist layer 108 intact. This creates a series of trenches in the first photoresist layer 104 and the second photoresist layer 108 (e.g., in the same locations as the trenches created in FIG. 1B). Collectively, the remaining portions of the first photoresist layer 104, the seed layer 106, and the second photoresist layer 108 form a dual-layer photoresist structure.

Figure 1E:
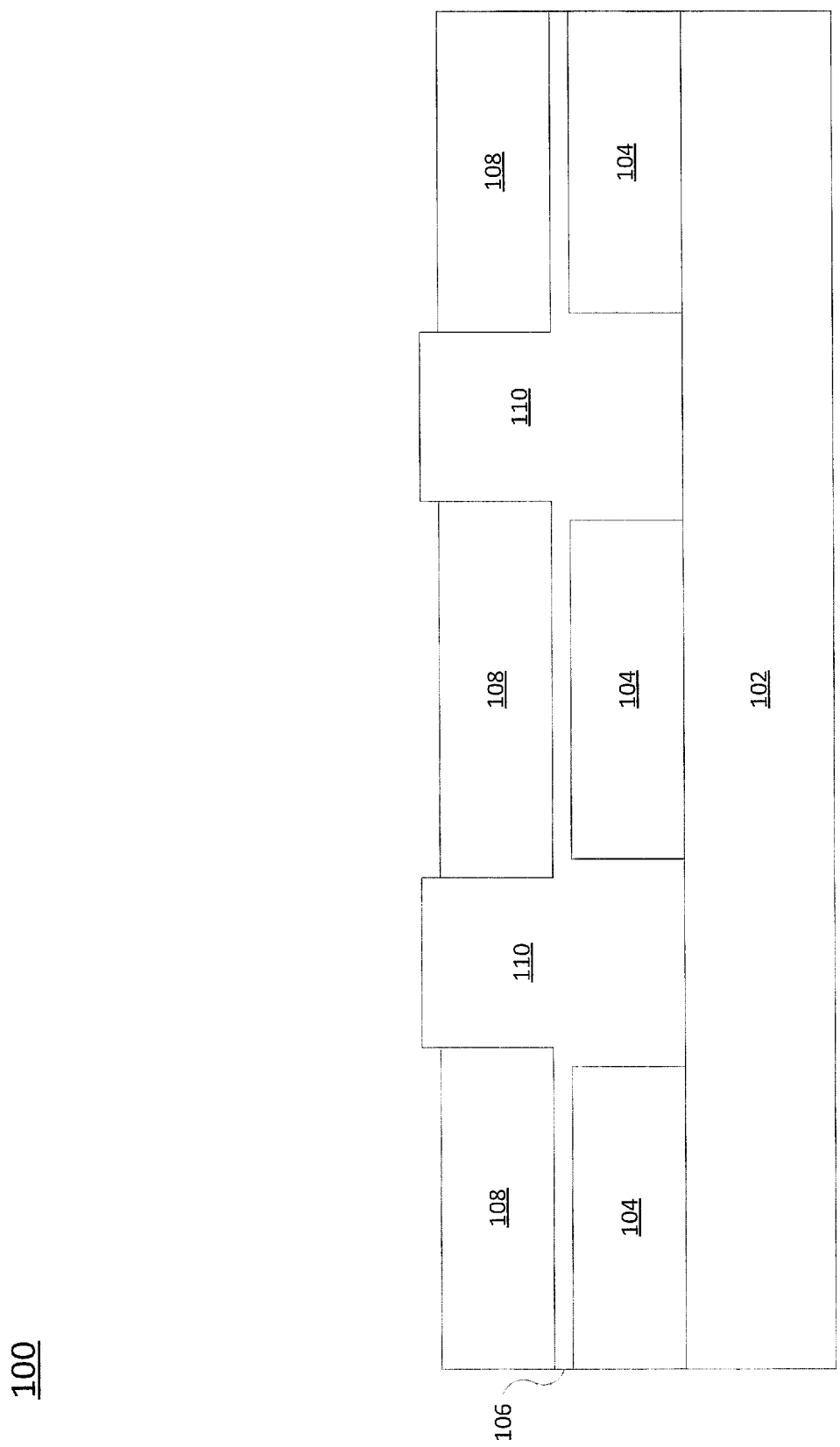

Referring to FIG. 1E, a stressor layer 110 is next deposited directly over the seed layer 106 and the second photoresist layer 108. The stressor layer 110 may be deposited, for example, by plating. The stressor layer 110 fills in the trenches in the first photoresist layer 104 and the second photoresist layer 108. In one example, the stressor layer 110 comprises a material with tensile or ductile stress, such as nickel or tungsten (W). In one example, the stressor layer 110 and the seed layer 106 comprise the same material (e.g., nickel). However, in other examples, the stressor layer 110 is formed from a different material than the seed layer 106.

Figure 1F:
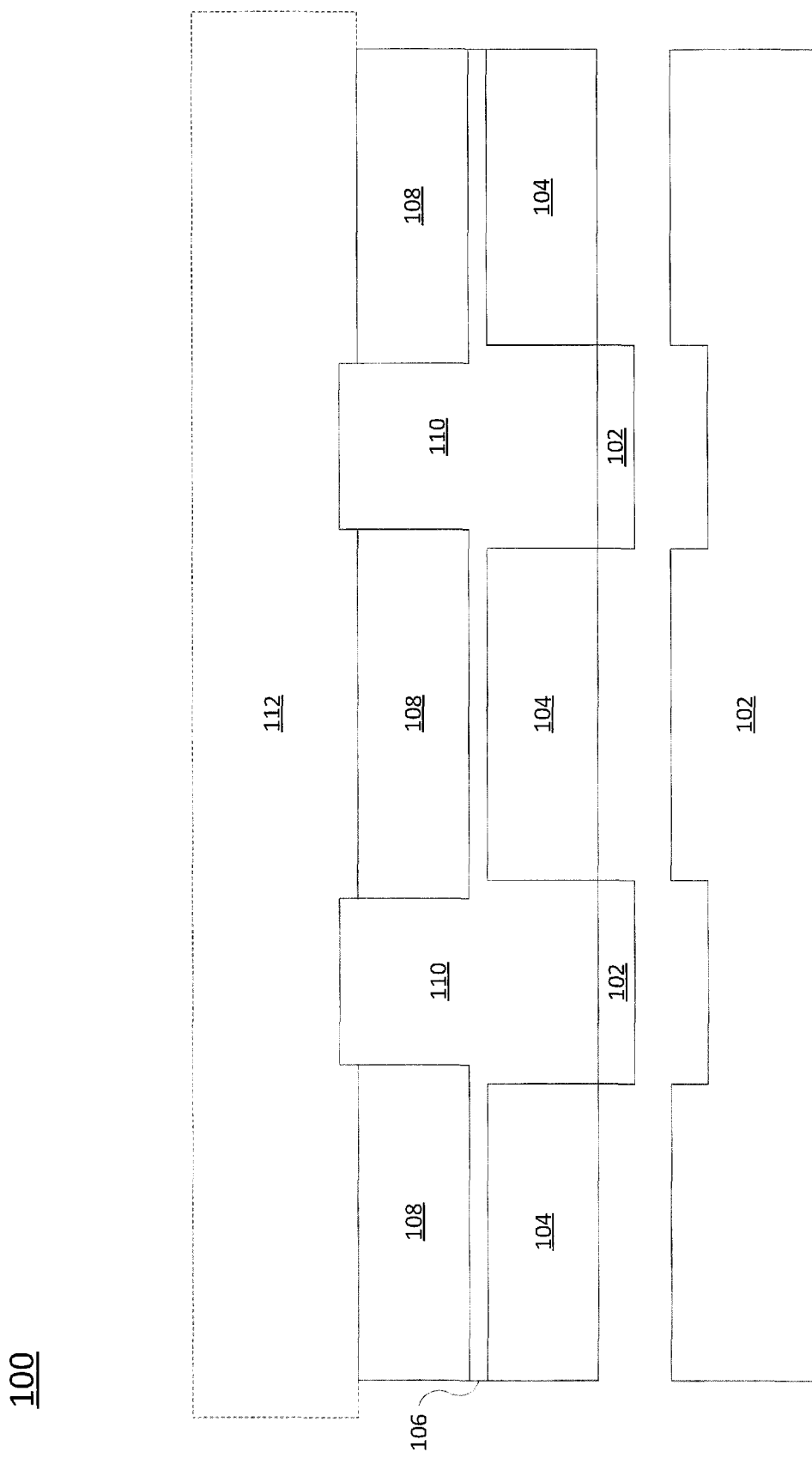

Referring to FIG. 1F, controlled spalling of the substrate 102 is next performed. In one embodiment, controlled spalling of the substrate 102 involves applying a first adhesive layer 112 to the second photoresist layer 108 and/or the stressor layer 110. In one example, the first adhesive layer 112 is comprises a detachable adhesive. The first adhesive layer 112 may comprise, for example, ultraviolet release tape having an adhesive strength that diminishes through exposure to ultraviolet irradiation. The controlled spalling may further involve activating stress to the substrate 102, e.g., through thermal processing of the stressor layer 110. The thermal processing may involve heating and/or cooling of the stressor layer 110 to induce the propagation of cracks in the substrate 102. After the stress has been activated, the first adhesive layer 112 is pulled in a direction away from the substrate 102. As illustrated in FIG. 1F, the first adhesive layer 112 lifts the first photoresist layer 104, the seed layer 106, the second photoresist layer 108, and the stressor layer 110 away from the substrate 102. Portions of the substrate 102 also detach from the body of the substrate 102 and adhere to the seed layer 106. The detached portions of the substrate 102 will form the fine features of the device being fabricated (e.g., portions of a resistor).

Figure 1G:
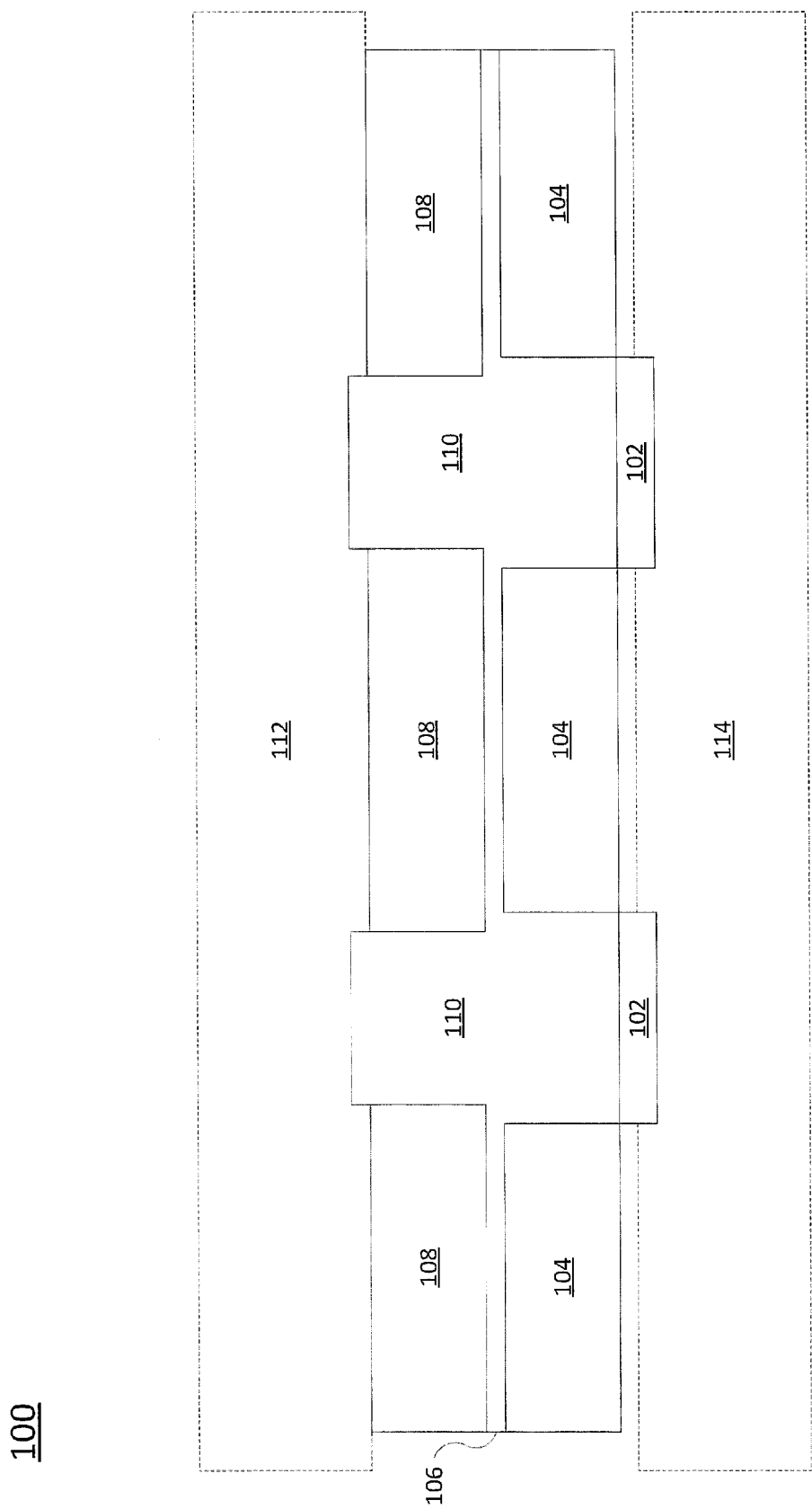

Referring to FIG. 1G, a second adhesive layer 114 is next applied to the detached or spalled surfaces of the substrate 102. The second adhesive layer 114 may comprise, for example, stretchable tape.

Figure 1H:
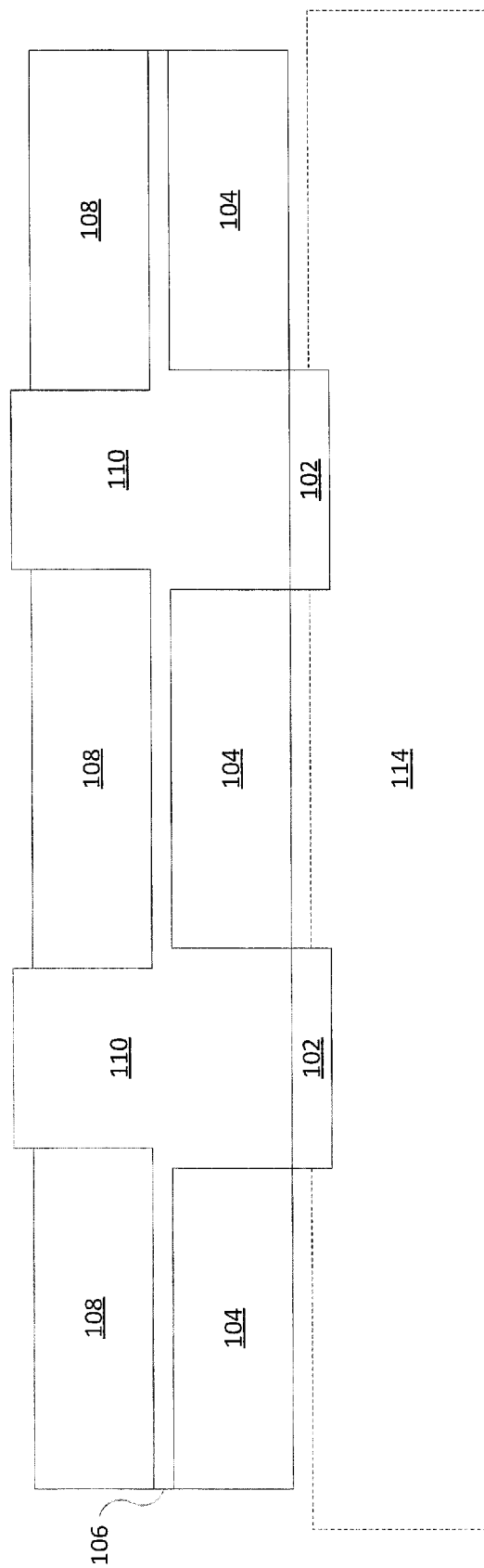

Referring to FIG. 1H, the first adhesive layer 112 is next released or removed from the structure 100. In one example, where the first adhesive layer 112 comprises ultraviolet release tape, the first adhesive layer 112 may be released by exposing it to ultraviolet irradiation until its adhesive strength has diminished to the point where the tape can be removed without undue effort or damage to the structure 100.

Figure 1I:
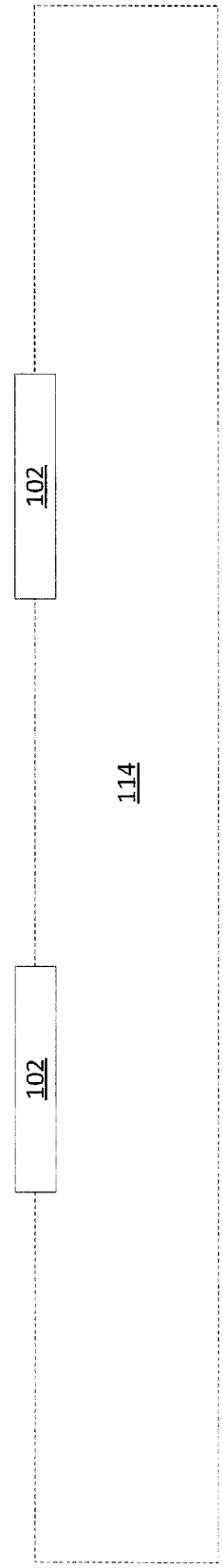

Referring to FIG. 1I, the first photoresist layer 104, the seed layer 106, the second photoresist layer 108, and the stressor layer 110 are next removed, for example by etching. This leaves the detached or spalled portions of the substrate 102 on the second adhesive layer 114. As discussed above, the detached or spalled portions of the substrate 102 will form the fine features of the device being fabricated (e.g., portions of a resistor).

Although various embodiments which incorporate the teachings of the present invention have been shown and described in detail herein, those skilled in the art can readily devise many other varied embodiments that still incorporate these teachings.

What is claimed is:

1. A method for fabricating a device, the method comprising:
    patterning a substrate with a set of features comprising a portion of the device;
    depositing a first photoresist layer on the substrate by a first deposition process;
    depositing a second photoresist layer on the first photoresist layer by a second deposition process; and
    inducing spalling of the features from the substrate, after depositing the second photoresist layer.

2. The method of claim 1, further comprising:
    patterning the first photoresist layer to create a series of trenches;
    depositing a conformal seed layer of a stressor material on the first photoresist layer after patterning the first photoresist layer but prior to depositing the second photoresist layer, such that the first photoresist layer and the second photoresist layer are physically separated by the seed layer; and
    patterning the second photoresist layer to maintain the series of trenches.

3. The method of claim 2, wherein at least some of the trenches in the series of trenches are positioned directly over the set of features.

4. The method of claim 2, wherein the seed layer comprises nickel.

5. The method of claim 2, wherein the inducing comprises:
    depositing a stressor layer directly on the second photoresist layer and within the series of trenches; and
    processing the stressor layer until the spalling is induced in the substrate.

6. The method of claim 5, wherein the processing comprises thermal processing.

7. The method of claim 5, wherein the stressor layer and the seed layer are formed from a same material.

8. The method of claim 5, wherein the stressor layer comprises nickel or tungsten.

9. The method of claim 5, further comprising:
    applying a first adhesive layer to the second photoresist layer and the stressor layer; and
    pulling the first adhesive layer in a direction away from the substrate, after spalling is induced, so that portions of the substrate are detached and lifted away from a body of the substrate.

10. The method of claim 9, wherein the first adhesive layer comprises ultraviolet release tape.

11. The method of claim 9, further comprising:
    applying a second adhesive layer to the portions of the substrate that are detached;
    releasing the first adhesive layer; and
    removing the first photoresist layer, the second photoresist layer, and the stressor layer, so that the portions of the substrate that are detached remain on the second adhesive layer.

12. The method of claim 11, wherein the second adhesive layer comprises stretchable tape.

13. The method of claim 12, wherein the releasing comprises:
    irradiating the first adhesive layer.

14. The method of claim 1, wherein the device comprises a resistor.

15. A method for fabricating a device, the method comprising:
    patterning a substrate with a set of features comprising a portion of the device;
    depositing a first photoresist layer on the substrate;
    patterning the first photoresist layer to create a series of trenches;
    depositing a conformal seed layer on the first photoresist layer and in the series of trenches;
    depositing a second photoresist layer on the seed layer;

patterning the second photoresist layer to maintain the series of trenches;

depositing a stressor layer on the second photoresist layer and in the series of trenches;

applying a first adhesive layer to the stressor layer;

inducing spalling of the features from the substrate; and pulling the first adhesive layer in a direction away from the substrate, after spalling is induced, so that portions of the substrate are detached and lifted away from a body of the substrate.

16. The method of claim 15, wherein the stressor layer and the seed layer are formed from a same material.

17. The method of claim 16, wherein the stressor layer and the seed layer are formed from nickel.

18. The method of claim 15, further comprising:

applying a second adhesive layer to the portions of the substrate that are detached;

releasing the first adhesive layer; and removing the first photoresist layer, the second photoresist layer, and the stressor layer, so that the portions of the substrate that are detached remain on the second adhesive layer.

19. The method of claim 18, wherein the releasing comprises:

irradiating the first adhesive layer.

20. The method of claim 18, wherein the second adhesive layer comprises stretchable tape.

* * * * *